US008217299B2

(12) United States Patent
Ilic et al.

(10) Patent No.: US 8,217,299 B2
(45) Date of Patent: Jul. 10, 2012

(54) ARC RECOVERY WITHOUT OVER-VOLTAGE FOR PLASMA CHAMBER POWER SUPPLIES USING A SHUNT SWITCH

(75) Inventors: Milan Ilic, Fort Collins, CO (US); Vladislav V. Shilo, Fort Collins, CO (US); Robert Brian Huff, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 243 days.

(21) Appl. No.: 11/677,786

(22) Filed: Feb. 22, 2007

(65) Prior Publication Data

US 2008/0203070 A1 Aug. 28, 2008

(51) Int. Cl.
*B23K 9/02* (2006.01)
*G01R 31/08* (2006.01)
*H01J 7/24* (2006.01)
*H01J 17/26* (2012.01)

(52) U.S. Cl. ......... 219/121.57; 219/121.36; 219/121.43; 219/121.54; 324/536; 315/111.21; 315/111.51; 313/231.31; 313/231.41; 313/231.51

(58) Field of Classification Search .................. 324/536; 219/121.57, 121.54, 121.36, 121.43; 204/192.14, 204/192.12, 298, 192 E, 192 R; 315/111.21, 315/111.51; 313/231.31, 231.41, 231.51
See application file for complete search history.

(56) References Cited

U.S. PATENT DOCUMENTS

| | | |
|---|---|---|
| 3,867,669 A | 2/1975 | Krasik |
| 4,428,023 A | 1/1984 | Maier |
| 4,459,629 A | 7/1984 | Titus |
| 4,740,858 A | 4/1988 | Yamaguchi et al. |
| 4,792,730 A | 12/1988 | Mintchev et al. |
| 4,871,421 A | 10/1989 | Ogle et al. |
| 4,936,960 A | 6/1990 | Siefkes et al. |
| 4,999,760 A | 3/1991 | Tietema |
| 5,192,894 A | 3/1993 | Teschner |
| 5,241,152 A | 8/1993 | Anderson |
| 5,281,321 A | 1/1994 | Sturmer et al. |
| 5,286,360 A | 2/1994 | Szczyrbowski |

(Continued)

FOREIGN PATENT DOCUMENTS

EP 0564789 A1 2/1993

(Continued)

OTHER PUBLICATIONS

Lee W. Young, International Search Report, Jun. 25, 2008, International Searching Authority/US, Alexandria, VA, USA.

(Continued)

*Primary Examiner* — Tu B Hoang
*Assistant Examiner* — Ket D Dang
(74) *Attorney, Agent, or Firm* — Neugeboren O'Dowd PC; Sean R. O'Dowd

(57) ABSTRACT

A system and method for over-voltage protection is described. In one embodiment of the invention, an apparatus includes an output port configured to deliver power to a plasma chamber to ignite a plasma. The apparatus also includes a shunt switch in parallel with the output port and a processor configured to receive an indicator of an arc in the plasma. The processor is configured to close the shunt switch for a period of time to divert current away from the arc. The processor is also configured to trigger a pulse of the shunt switch to limit a voltage of an increasing voltage condition associated with the arc.

11 Claims, 5 Drawing Sheets

U.S. PATENT DOCUMENTS

| | | | |
|---|---|---|---|
| 5,303,139 A * | 4/1994 | Mark | 363/63 |
| 5,307,004 A | 4/1994 | Carsten | |
| 5,415,757 A | 5/1995 | Szczyrbowski et al. | |
| 5,418,707 A | 5/1995 | Shimer et al. | |
| 5,427,669 A | 6/1995 | Drummond | |
| 5,535,906 A | 7/1996 | Drummond | |
| 5,573,596 A | 11/1996 | Yin | |
| 5,576,939 A | 11/1996 | Drummond | |
| 5,584,972 A | 12/1996 | Lantsman | |
| 5,584,974 A | 12/1996 | Sellers | |
| 5,611,899 A | 3/1997 | Maass | |
| 5,616,224 A | 4/1997 | Boling | |
| 5,645,698 A | 7/1997 | Okano | |
| 5,651,865 A | 7/1997 | Sellers | |
| 5,682,067 A | 10/1997 | Manley | |
| 5,698,082 A | 12/1997 | Teschner et al. | |
| 5,718,813 A | 2/1998 | Drummond | |
| 5,750,971 A | 5/1998 | Taylor | |
| 5,814,195 A | 9/1998 | Lehan et al. | |
| 5,815,388 A | 9/1998 | Manley et al. | |
| 5,851,365 A | 12/1998 | Scobey | |
| 5,882,492 A | 3/1999 | Manley et al. | |
| 5,889,391 A | 3/1999 | Coleman | |
| 5,917,286 A * | 6/1999 | Scholl et al. | 315/111.21 |
| 5,945,786 A * | 8/1999 | Jurek | 315/276 |
| 5,971,591 A * | 10/1999 | Vona et al. | 700/220 |
| 6,001,224 A | 12/1999 | Drummond | |
| 6,005,218 A | 12/1999 | Walde et al. | |
| 6,024,844 A | 2/2000 | Drummond | |
| 6,080,292 A | 6/2000 | Matsuzawa et al. | |
| 6,161,332 A | 12/2000 | Avot | |
| 6,162,332 A | 12/2000 | Chiu | |
| 6,174,450 B1 | 1/2001 | Patrick et al. | |
| 6,176,979 B1 | 1/2001 | Signer | |
| 6,217,717 B1 | 4/2001 | Drummond et al. | |
| 6,222,321 B1 * | 4/2001 | Scholl et al. | 315/111.21 |
| 6,258,219 B1 | 7/2001 | Mueller | |
| 6,332,961 B1 | 12/2001 | Johnson et al. | |
| 6,365,009 B1 | 4/2002 | Ishibashi | |
| 6,416,638 B1 | 7/2002 | Kuriyama et al. | |
| 6,440,281 B1 | 8/2002 | Sturmer | |
| 6,447,655 B2 | 9/2002 | Lantsman | |
| 6,447,719 B1 | 9/2002 | Agamohamadi et al. | |
| 6,472,822 B1 * | 10/2002 | Chen et al. | 315/111.21 |
| 6,521,099 B1 | 2/2003 | Drummond et al. | |
| 6,522,076 B2 | 2/2003 | Goedicke | |
| 6,524,455 B1 | 2/2003 | Sellers | |
| 6,552,295 B2 | 4/2003 | Markunas et al. | |
| 6,577,479 B1 | 6/2003 | Springer et al. | |
| 6,621,674 B1 | 9/2003 | Zahringer | |
| 6,636,545 B2 | 10/2003 | Krasnov | |
| 6,708,645 B1 | 3/2004 | Choquette | |
| 6,736,944 B2 | 5/2004 | Buda | |
| 6,740,207 B2 | 5/2004 | Kloeppel et al. | |
| 6,753,499 B1 | 6/2004 | Yasaka et al. | |
| 6,808,607 B2 | 10/2004 | Christie | |
| 6,817,388 B2 | 11/2004 | Tsangaris | |
| 6,876,205 B2 | 4/2005 | Walde et al. | |
| 6,878,248 B2 | 4/2005 | Signer | |
| 6,894,245 B2 | 5/2005 | Hoffman et al. | |
| 6,943,317 B1 * | 9/2005 | Ilic et al. | 219/121.57 |
| 6,967,305 B2 | 11/2005 | Sellers | |
| 7,026,174 B2 | 4/2006 | Fischer | |
| 7,030,335 B2 | 4/2006 | Hoffman et al. | |
| 7,081,598 B2 | 7/2006 | Ilic | |
| 7,086,347 B2 | 8/2006 | Howald et al. | |
| 7,095,179 B2 | 8/2006 | Chistyakov | |
| 7,132,618 B2 | 11/2006 | Hoffman et al. | |
| 7,261,797 B2 | 8/2007 | Sellers | |
| 7,305,311 B2 | 12/2007 | Van Zyl | |
| 7,514,935 B2 * | 4/2009 | Pankratz | 324/536 |
| 7,651,492 B2 | 1/2010 | Wham | |
| 2001/0047933 A1 | 12/2001 | Lantsman | |
| 2002/0104753 A1 | 8/2002 | Kloeppel et al. | |
| 2002/0108933 A1 | 8/2002 | Hoffman et al. | |
| 2003/0136766 A1 | 7/2003 | Hoffman et al. | |
| 2003/0141286 A1 * | 7/2003 | Yamaguchi et al. | 219/121.57 |
| 2003/0146083 A1 | 8/2003 | Sellers | |
| 2003/0205460 A1 * | 11/2003 | Buda | 204/192.13 |
| 2003/0205557 A1 | 11/2003 | Benjamin et al. | |
| 2004/0026235 A1 | 2/2004 | Stowell, Jr. | |
| 2004/0055881 A1 | 3/2004 | Christie | |
| 2004/0104681 A1 * | 6/2004 | Mitrovic | 315/111.21 |
| 2004/0124077 A1 | 7/2004 | Christie | |
| 2004/0149699 A1 | 8/2004 | Hofman et al. | |
| 2004/0182696 A1 | 9/2004 | Kuriyama et al. | |
| 2004/0182697 A1 | 9/2004 | Buda | |
| 2004/0245999 A1 * | 12/2004 | Walde et al. | 324/536 |
| 2005/0040144 A1 * | 2/2005 | Sellers | 219/121.54 |
| 2005/0092596 A1 | 5/2005 | Kouznetsov | |
| 2005/0167262 A1 | 8/2005 | Sellers | |
| 2005/0236377 A1 | 10/2005 | Hoffman et al. | |
| 2006/0049831 A1 | 3/2006 | Anwar et al. | |
| 2006/0054601 A1 | 3/2006 | Ilic | |
| 2006/0066248 A1 | 3/2006 | Chistyakov | |
| 2006/0189168 A1 | 8/2006 | Sato et al. | |
| 2006/0213761 A1 | 9/2006 | Axenbeck et al. | |
| 2006/0241879 A1 | 10/2006 | van Zyl | |
| 2006/0252283 A1 | 11/2006 | Takeda et al. | |
| 2007/0008034 A1 | 1/2007 | Tayrani | |
| 2007/0042131 A1 | 2/2007 | Soo et al. | |
| 2008/0061794 A1 | 3/2008 | Pankratz | |
| 2008/0122369 A1 * | 5/2008 | Nitschke | 315/111.21 |
| 2008/0156632 A1 | 7/2008 | Van Zyl | |
| 2008/0309402 A1 | 12/2008 | Ozimek et al. | |
| 2010/0026186 A1 | 2/2010 | Forest et al. | |
| 2010/0213903 A1 | 8/2010 | Ozimek et al. | |

FOREIGN PATENT DOCUMENTS

| | | |
|---|---|---|
| WO | WO2006014212 A2 | 2/2006 |
| WO | WO2006023847 A1 | 3/2006 |
| WO | WO2008033968 A2 | 3/2008 |

OTHER PUBLICATIONS

Young, Lee W., "PCT International Search Report re Application No. PCT/US08/054056", Jun. 25, 2008, Published in: PCT.

Kolev, Vesselin, "PCT International Search Report re Application No. PCT/US09/066899", Feb. 19, 2010, Published in: PCT.

Kim, Ki Wan, "PCT International Search Report re Application No. PCT/US09/051174", Feb. 24, 2010, Publisher: PCT, Published in: PCT.

Chinese Patent Office, "First Office Action re Chinese Patent Application 2008-80009384.6", May 25, 2011, p. 24, Published in: CN.

Burke, J., "International Search Report re Application No. PCT/US07/078339", Aug. 29, 2008, p. 10, Published in: PCT.

* cited by examiner

ARC RECOVERY WITHOUT OVER-VOLTAGE FOR PLASMA CHAMBER POWER SUPPLIES USING A SHUNT SWITCH

FIELD OF THE INVENTION

The present invention relates to plasma chamber power supplies. In particular, but not by way of limitation, the present invention relates to over-voltage protection for plasma chamber power supplies.

BACKGROUND OF THE INVENTION

Many power supplies for plasma chambers include an output filter stage that consists of energy storing components such as inductors and capacitors. These output filter stages are often used to, for example, reduce ripple in an output voltage of the power supply. If a plasma arc occurs within a plasma chamber that is receiving power from a power supply of this type, energy can be circulated within the energy storing components of the power supply for a period of time using a shunt switch in order to extinguish the plasma arc. After the plasma arc is extinguished, however, the energy circulated within the power supply can cause, for example, an over-voltage condition that can damage the power supply and/or plasma chamber if the energy is released to the plasma chamber.

Many types of over-voltage protection circuits have been used in power supplies to protect the power supply and/or plasma chamber from an over-voltage condition after a plasma arc has been extinguished. Some simple over-voltage protection circuit designs include passive components such as RC snubber circuits, transient voltage suppressor circuits, or metal oxide varistors that are used to dissipate energy. But many of these components must be large to handle the large number of plasma arcs that can occur, and the energy associated with one or more plasma arcs is dissipated rather than used by the power supply. Although some circuits can be designed to use the energy associated with a plasma arc by transferring the energy back to an input bus of the power supply, these designs are often quite complex and expensive. In other words, many current power supply designs are functional but are either too complex, expensive and/or inefficient. Accordingly, methods and apparatus are needed to address the shortfalls of present technology and to provide other new and innovative features. Accordingly, there is a need for improved plasma chamber power supply over-voltage protection methods and apparatus.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for over-voltage protection of plasma chamber power supplies. In one embodiment of the invention, an apparatus includes an output port configured to deliver power to a plasma chamber to ignite a plasma. The apparatus also includes a shunt switch in parallel with the output port and a processor configured to receive an indicator of an arc in the plasma. The processor is configured to close the shunt switch for a period of time to divert current away from the arc. The processor is also configured to trigger a pulse of the shunt switch to limit a voltage of an increasing voltage condition associated with the arc.

Another embodiment of the present invention is an apparatus that includes a shunt switch configured to divert current away from an arc in a plasma chamber. The shunt switch is configured to pulse according to a pulse parameter value. The pulse of the shunt switch limits a voltage of an increasing voltage condition associated with the arc. The apparatus also includes a processor configured to receive a plasma system parameter value. The shunt switch and the processor are associated with a power supply unit. The plasma system parameter value is associated with the power supply unit, and the processor is configured to calculate the pulse parameter value based on the plasma system parameter value.

In yet another embodiment, a method includes delivering power from a power supply unit to a plasma chamber to ignite and sustain a plasma and detecting an arc in the plasma. A current associated with the arc is diverted away from the plasma at substantially a beginning of the arc by closing at a first time for a time period a shunt switch within the power supply unit. The shunt switch is opened at a second time at the end of the time period and an increasing voltage condition is triggered when the shunt switch is opened. The shunt switch is pulsed, after the shunt switch is opened at the second time, to limit the voltage of the increasing voltage condition.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
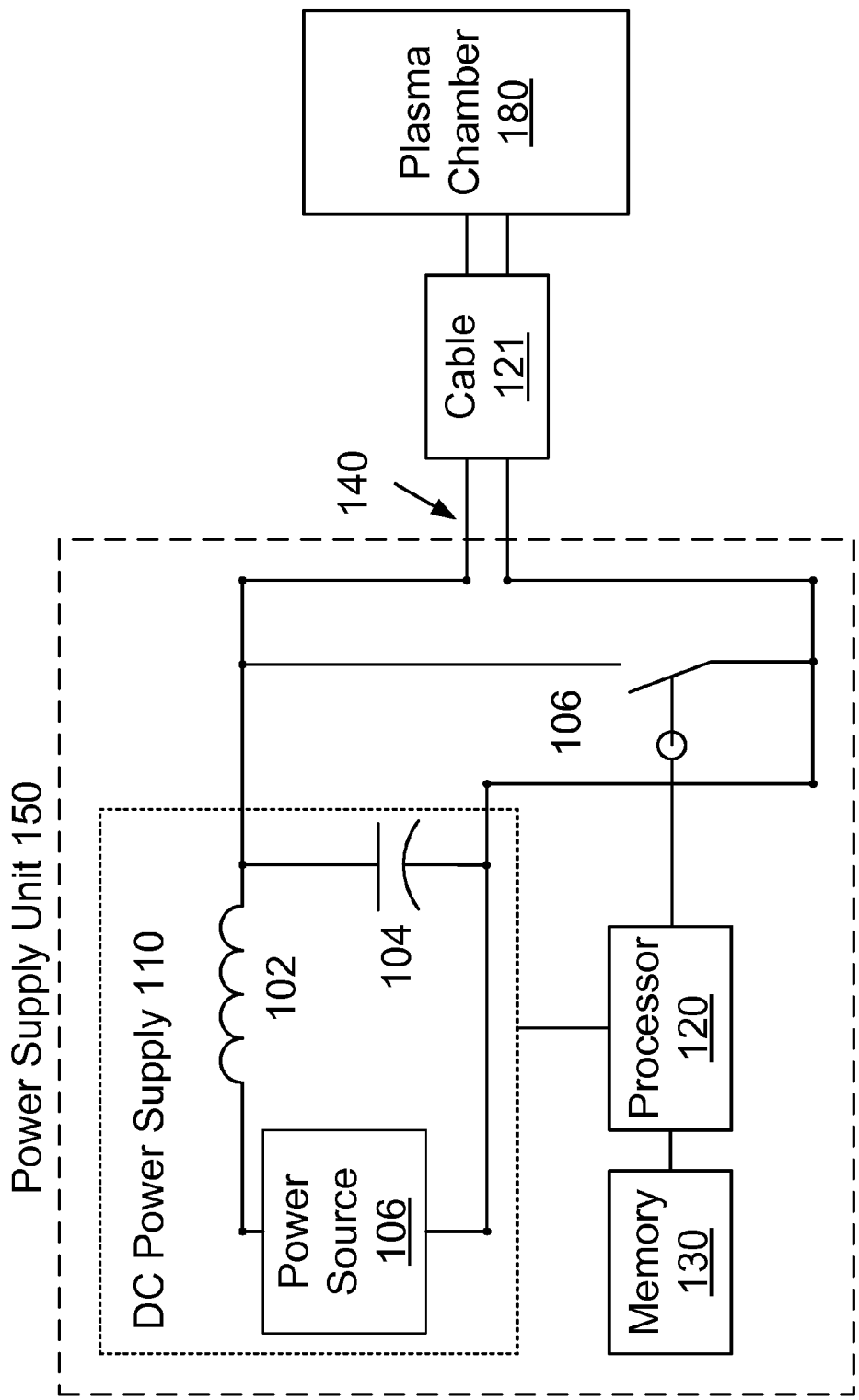
FIG. 1 illustrates a power supply unit, according to an embodiment of the invention.

Referring now to the drawings, where like or similar elements are designated with identical reference numerals throughout the several views, and referring in particular to FIG. 1, it illustrates a power supply unit 150 according to an embodiment of the invention. As shown, a direct current (DC) power supply 110 within the power supply unit 150 is configured to supply power through an output 140 (also referred to as an output port) and via a cable 121 to ignite and/or sustain a plasma in a plasma chamber 180. In some embodiments, the plasma chamber 180 is used, for example, to deposit a thin film on a silicon semiconductor substrate during a semiconductor processing step.

The processor 120 of the power supply unit 150 is configured to trigger (e.g., toggle) one or more pulse cycles of a shunt switch 106 to mitigate the possibility of over-voltage after a micro arc within the plasma chamber 180 has been extinguished using shunt switch 106. Each of the pulse cycles is triggered according to one or more pulse parameter values (e.g., at a specified time(s), for a specified duration(s) or on-time, with a specified off-time, at specified intervals). One or more pulses of shunt switch 106 reduce an increase in voltage that can result from the release of energy from the micro arc stored in, for example, inductor 102 and/or capacitor 104. After the pulses of shunt switch 106 have been performed, the power supply unit 150 returns to a normal operating mode until another micro arc occurs.

Micro arcs (also can be referred to as arcs or as cathodic arcs) can develop during normal operation within the plasma chamber 180 when a discharge occurs in the plasma chamber 180 (e.g., between a point on an insulator where charge has accumulated and a point on a plasma source/cathode). If the micro arc is not extinguished in a sufficiently short period of time, the micro arc can develop into a hard arc through a cascading effect. Although the density of power of a hard arc is larger than that of a micro arc, both types of arcs can have a detrimental effect on, for example, the plasma chamber 100 and/or an object (e.g., semiconductor substrate) within the plasma chamber 100.

The power supply unit 150, in this embodiment, is configured with an inductor 102 and a capacitor 104 within the DC power supply 110. In this embodiment, high compliance in the power supply unit 150 is achieved using the inductance 102 in series with the output 140 according to techniques known to those of ordinary skill in the art. In some embodiments, an inductance of the cable 121 is leveraged in place of the inductor 104 in the DC power supply 110. The capacitor 104 (also referred to as an output capacitor 104) is connected in parallel with the DC power supply 110 and is designed to store a relatively small amount of energy while still providing adequate filtering for the power supply unit 150. In some implementations, the capacitor 104 is designed to be sufficiently small to limit the rise in the output current of the power supply unit 150 when micro arcs occur to reduce the possibility that the micro arc will develop into a hard arc.

The processor 120 of the power supply unit 150 is configured to detect the initiation of a micro arc (or hard arc) within a plasma of the plasma chamber 180 and is configured to temporarily divert current away from the micro arc to extinguish the micro arc using the shunt switch 106. The current is diverted because the micro arc can be extinguished by reducing the current through the micro arc to zero (e.g., substantially zero) or some predetermined low threshold value. The diverted current is circulated within inductor 102 of the DC power supply 110 and the shunt switch 106 of power supply unit 150.

The processor 120 of the power supply unit 150 is configured to divert the current by first triggering closing of the shunt switch 106 to shunt current away from the plasma and into the DC power supply 110. After the shunt switch 106 has been closed for a period of time, the shunt switch 106 is later opened to re-supply current to the plasma within the plasma chamber 180. This initial closing to extinguish the micro arc after detection and opening to re-supply current to the plasma chamber 180 can be referred to as an extinguishing cycle.

After the arc is extinguished and the shunt switch 106 is opened, the energy stored in the inductor 102 and/or capacitor 104 is released to the plasma. This release of energy can generate a very high output voltage on the output 140 as a result of a very high change in current over a short period of time. This change in current over a short period of time, which can result in an over-voltage condition, can cause damage to the power supply unit 150 and/or the plasma chamber 180.

After the extinguishing cycle has been performed, the processor 120 is configured to trigger pulses (e.g., opening and closing) of the shunt switch 106 to prevent or reduce the possibility of an over-voltage condition by limiting the output voltage of the power supply. Specifically, pulses (e.g., pulse cycles) triggered using shunt switch 106 reduce the output voltage of the output 140 when energy stored in the inductor 102 is released after shunt switch 106 is closed at the end of the extinguishing cycle. After the pulses of shunt switch 106 have been performed according to defined pulse parameter values, the power supply unit 150 returns to a normal operating mode with the shunt switch 106 remaining open. In some embodiments, the shunt switch 106 is an insulated-gate bipolar transistor (IGBT), field effect transistor (FET), or other suitable switch. Specific examples of extinguishing cycles and pulsing of a shunt switch are shown in FIGS. 2A through 2C, and FIGS. 5A through 5C.

Although not shown in this embodiment, the power supply unit 150 can also be configured to include an over-voltage protection circuit that can be used to provide protection of the power supply unit 150 and/or plasma chamber 180 in the event of an over-voltage condition. In some implementations, the processor 120 is configured to directly cause the shunt switch 106 to open and close, and in other implementations, the processor 120 is configured to send a trigger signal that is used by a separate component (not shown) to open and close the shunt switch 106.

In the embodiment depicted in FIG. 1, the power supply unit 150 includes a memory 130 that is configured to store information that is used by the processor 120 to trigger one or more extinguishing cycles and/or one or more pulse cycles. The memory 130 includes limits and/or parameters that are used to trigger and define the extinguishing cycle. For example, the memory 130 can include threshold conditions (e.g., voltage levels, durations) that are used to trigger the extinguishing cycle and parameter values that are used to define the duration of the extinguishing cycle. The memory 130 also includes threshold limits and/or pulse parameter values that are used to trigger and define the pulses of the shunt switch 106, respectively. Pulse parameter values include, for example, a pulse width (e.g., on-time), a pulse period, a number of pulses, and/or an off-time.

The pulse parameter values can be defined based on plasma system parameter values such as, for example, an output inductance of power supply unit 150, an output capacitance of the power supply unit 150, an output voltage of the power supply unit 150, or output current of the power supply unit 150. For example, pulse parameter values for a narrow pulse can be defined and used to eliminate over-voltage or reduce the possibility of an over-voltage condition when power supply 150 has a high output current and/or the output capacitance of the DC power supply 110 is small. Conversely, pulse parameter values for a wide pulse can be defined and used to eliminate over-voltage or reduce the possibility of an over-voltage condition when power supply 150 has a low output current and/or the output capacitance of the DC power supply 110 is high. In some implementations, the rate of voltage rise can be predicted/calculated based on the output current of, for example, the power supply unit 150, and/or the magnitude of output capacitance of, for example, the power supply unit 150. In some embodiments, pulse parameter values are defined based on a calculation/prediction of the rate of voltage rise.

In some embodiments, the memory 130 includes threshold conditions (e.g., time periods) that are used to trigger one or more pulses defined based on one or more sets of pulse parameter values. In some variations, the limits, parameter values associated with the extinguishing cycle, plasma system parameter values, and/or pulse parameter values are stored in the memory 130 as, for example, a table or a text file that can be retrieved and processed by the processor 120.

In some embodiments, functions performed by the processor 120 can be performed on more than one processor and/or a combination of hardware and/or software modules included in the power supply unit 150. The memory 130, in some embodiments, is embedded into the processor 120 as, for example, a small cache or in other embodiments is a separate memory device such as a random access memory (RAM) or removable storage device.

Figure 2A:
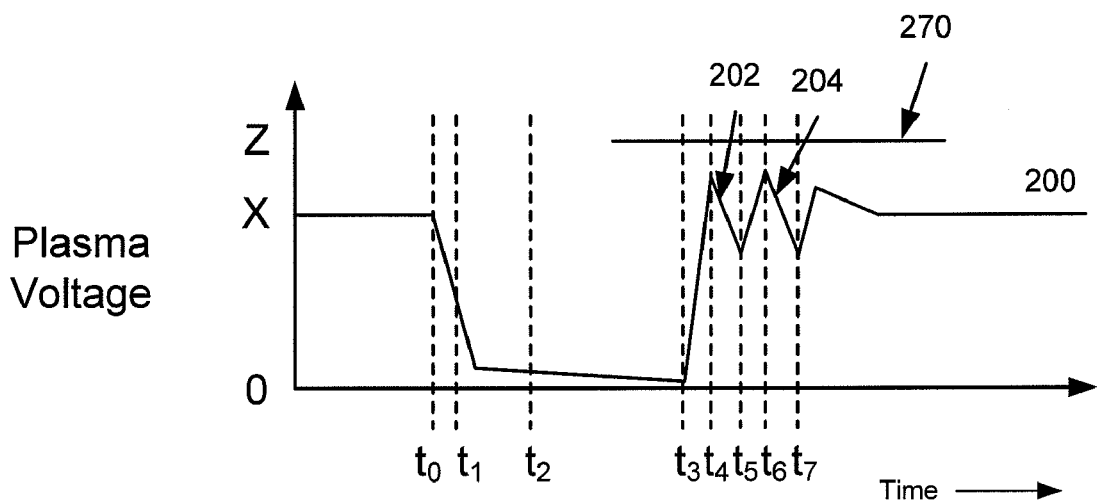
FIG. 2A is a schematic graph that illustrates a plasma voltage within a plasma chamber, according to an embodiment of the invention.
Figure 2B:
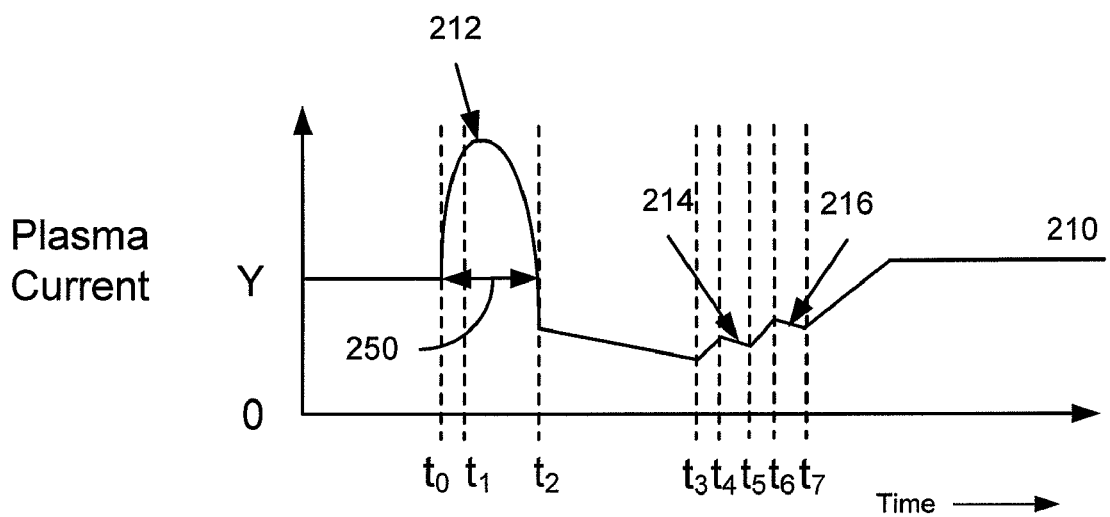
FIG. 2B is a schematic graph that illustrates a plasma current within the plasma chamber, according to an embodiment of the invention.
Figure 2C:
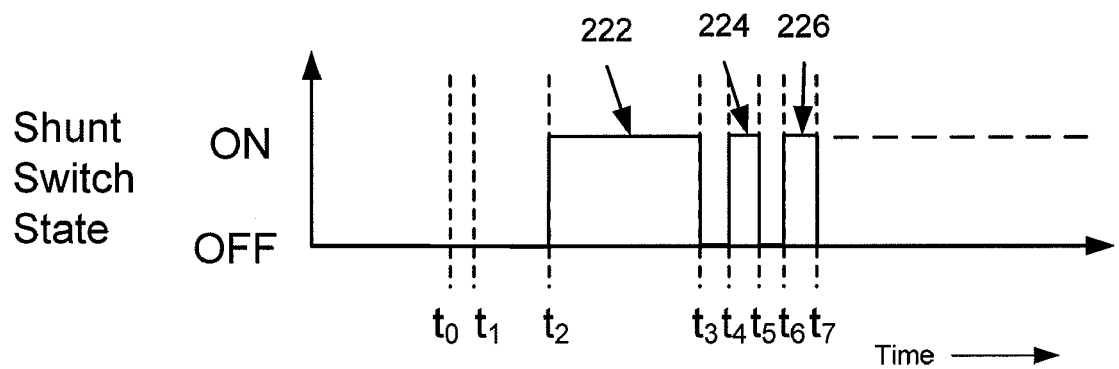
FIG. 2C is a schematic graph that illustrates a switch state of a shunt switch within the power supply unit being used to supply power to the plasma chamber, according to an embodiment of the invention.

FIGS. 2A through 2C are schematic graphs that illustrate extinguishing of an arc (e.g., micro arc) and prevention of an over-voltage condition using a power supply unit such as that shown in FIG. 1, according to an embodiment of the invention. Specifically, FIG. 2A is a schematic graph that illustrates a plasma voltage within a plasma chamber and FIG. 2B is a schematic graph that illustrates a plasma current within the plasma chamber, according to an embodiment of the invention. FIG. 2C is a schematic graph that illustrates a switch state of a shunt switch within the power supply unit being used to supply power to the plasma chamber, according to an embodiment of the invention. Time increases to the right on the x-axis of each of the graphs.

FIG. 2A illustrates that starting at time to the plasma voltage drops from a voltage value of X to nearly zero in response to the formation of an arc within the plasma chamber. The voltage value X is the output voltage set point of the power supply unit. This drop in voltage corresponds with an increase in the plasma current shown in FIG. 2B also starting at time $t_0$. At time $t_1$, the arc is detected, for example, by the power supply unit based on a measurement value of the plasma current exceeding a threshold plasma current limit or based on a measurement value of the plasma voltage falling below a threshold plasma voltage limit. In some embodiments, a delay in the detection of the arc is caused by an inductance of a cable connecting the plasma chamber with the power supply unit.

FIG. 2B illustrates that a natural ring-out of the arc occurs using a capacitor of the power supply unit in parallel with the plasma chamber and an inductor (e.g., inductance of a cable connecting the power supply unit and the plasma chamber) such as those shown in FIG. 1. The time period 250 can be referred to as the ring-out time period. During the ring-out time period, the plasma current briefly increases, as depicted by the arc curve 212, from a plasma current Y (shown in FIG. 2B) that is produced by the power supply unit at output voltage set point X (shown in FIG. 2A). More details regarding the ring-out of an arc are set forth in commonly owned and assigned U.S. Pat. No. 6,943,317, "Apparatus and Method for Fast Arc Extinction with Early shunting of Arc Current in Plasma," which is incorporated herein by reference in its entirety.

In response to the arc being detected, the power supply unit initiates an arc extinguishing cycle 222 starting at time $t_2$. During the arc extinguishing cycle 222 between times $t_2$ and $t_3$, the arc within the plasma chamber is substantially or entirely extinguished by diverting current away from the arc using the shunt switch of the power supply unit. As shown in FIG. 2B, the plasma current drops between times $t_2$ and $t_3$ in response to the shunt switch being turned on (i.e., closed, engaged) during the arc extinguishing cycle 222. In some embodiments, the duration of the on-time of extinguishing cycle 222 is defined to extinguish or substantially extinguish, for example, a particular type of arc with a specified level of current.

As shown in FIG. 2A, the voltage within the plasma chamber dramatically increases at time $t_3$ when the shunt switch is turned-off (i.e., opened) at the end of the arc extinguishing cycle 222 as shown in FIG. 2C. This dramatic increase in voltage can be referred to as an increasing voltage condition. The increase in voltage within the plasma chamber is the result of current being released to the plasma chamber at time $t_3$ (shown in FIG. 2B) from, for example, an inductor within the power supply unit that stores energy during the extinguishing cycle 222.

As shown in FIG. 2C, the shunt switch is turned-on for two pulses, pulses 224 and 226, to reduce the rising voltage of the plasma chamber. The first pulse 224 starts at time $t_4$ and ends at time $t_5$ and the second pulse 226 starts at time $t_6$ and ends at time $t_7$. The voltage within the plasma chamber, as shown in FIG. 2A, decreases between times $t_4$ and $t_5$, as well as between times $t_6$ and $t_7$, during the pulses 224 and 226, respectively. When the shunt switch is turned-off between pulses, such as between time $t_5$ and $t_6$, the voltage of the plasma chamber increases. Also, as shown in FIG. 2B, the plasma current decreases 214 and 216 during the on-time of the pulses 224 and 226, respectively.

The durations of the on-time and the off-times of the pulses 224 and 226 shown in FIG. 2C can be defined to affect the plasma voltage (shown in FIG. 2A) and the plasma current (shown in FIG. 2B) in a particular way. For example, an increase of one or more of the on-times of the pulses 224 and 226 can be defined to cause a larger decrease of the plasma voltage when either of the pulses 224 and 226 is triggered. The increase of the on-time(s) can cause a decrease in plasma current that can be used within the plasma chamber. In some embodiments, the pulses 224 and 226 depicted in FIG. 2C can be defined such that the plasma voltage does not exceed a voltage limit 270 at a voltage value of Z as shown in FIG. 2A. In some implementations, the on-time of the pulses 224 and/or 226 is a few micro-seconds and the off-time of the pulses 224 and 226 is a few micro-seconds.

Although two pulses are shown in FIGS. 2A through 2C, in some embodiments, different numbers of pulses are triggered. For example, in some embodiments, three or more pulses or one pulse can be triggered. In some implementations, the number of pulses and/or set of pulse parameter values is determined based on the duration of an extinguishing cycle (e.g., the extinguishing cycle 222), the level of the arc being extinguished (e.g., level of current), the rate of voltage increase after the arc has been extinguished, etc. A set of pulse parameter values, in some variations, is selected and/or retrieved from a library of pulse parameter values stored in a memory (e.g., the memory 130) based on one or more defined conditions.

At time $t_7$, the power supply unit returns to a normal operating mode with the shunt switch being turned off as shown in FIG. 2C. The plasma voltage, as shown in FIG. 2A starting at time $t_7$, is controlled by the power supply unit until the output voltage reaches the set point X. When the output voltage set point is reached as shown in FIG. 2A, the plasma current produced by the power supply unit is Y, as shown in FIG. 2B. In some embodiments, the power supply unit is returned to a normal operating mode after a specified period of time after the on-time of the final pulse (e.g., pulse 226).

Figure 3:
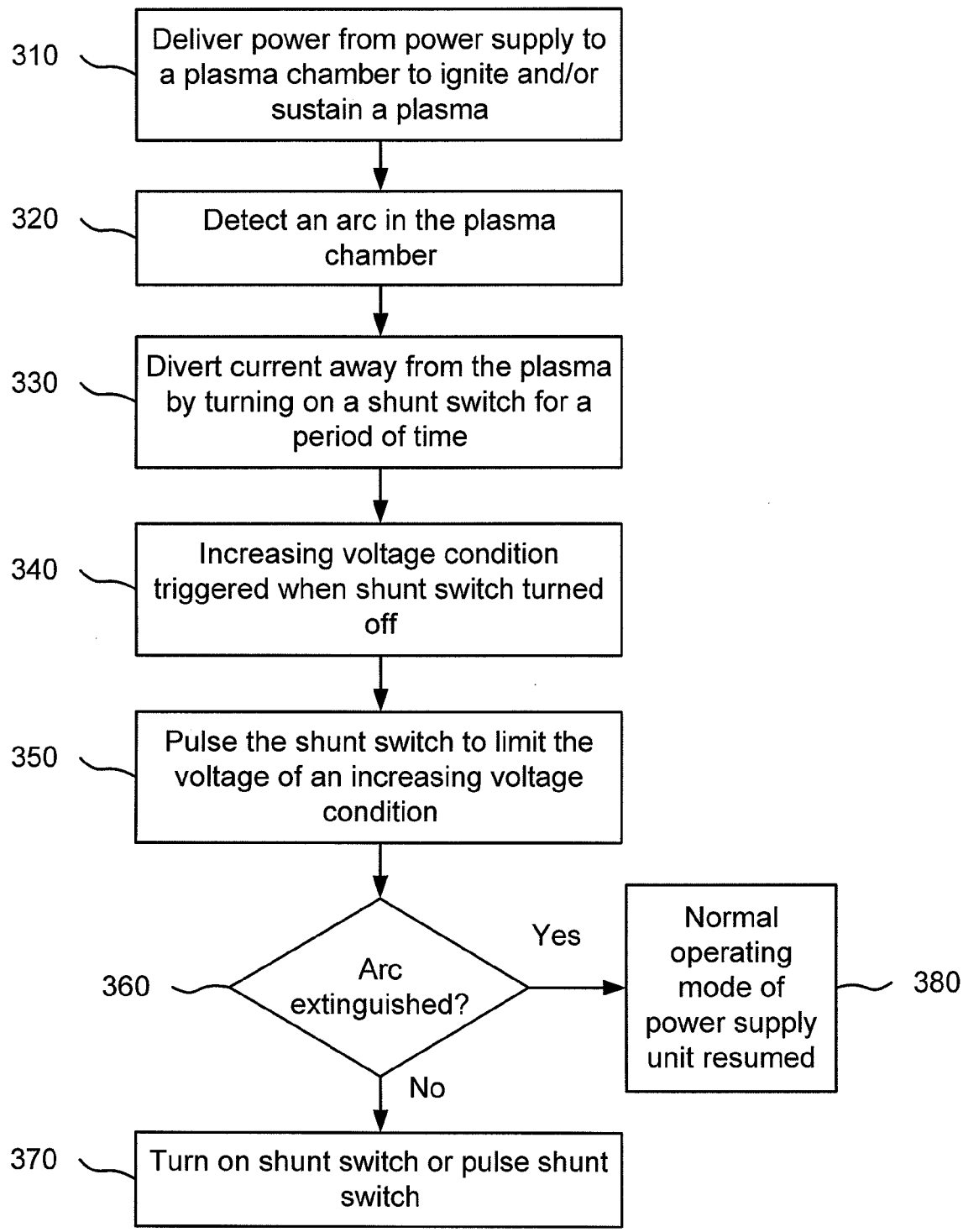
FIG. 3 is a flowchart that illustrates a method for pulsing a shunt switch according to an embodiment of the invention.

FIG. 3 is a flowchart that illustrates a method for pulsing a shunt switch (e.g., shunt switch 106) to eliminate and/or reduce the probability of an over-voltage condition after an arc within a plasma chamber (e.g., plasma chamber 180) is extinguished, according to an embodiment of the invention.

As shown in FIG. 3, power is delivered from a power supply (e.g., power supply 110) within a power supply unit (e.g., power supply unit 150) to a plasma chamber to ignite and/or sustain a plasma within the plasma chamber (block 310). In some embodiments, the power supply unit is configured to control the power, current or voltage levels of the plasma chamber.

As shown in FIG. 3, when an arc is detected in the plasma chamber (block 320), current is diverted away from the plasma within the plasma chamber by turning on (e.g., engaging) a shunt switch for a period of time (block 330). In some embodiments, the arc is a micro arc that develops in the plasma chamber when a discharge occurs between a point on an insulator where charge has accumulated and a point on a cathode within the plasma chamber. The arc is detected using current and/or voltage sensors in connection with? a processor of a power supply unit in some implementations.

As discussed with reference to FIGS. 2A-2C, the period of time during which current to the arc is initially diverted can be referred to as an arc extinguishing cycle (e.g., arc extinguishing cycle 222). In some embodiments, while current is diverted away from the plasma, the current is circulated within a DC power supply of a power supply unit.

At the end of the arc extinguishing cycle, the shunt switch is turned off (e.g., disengaged) and the voltage within the plasma chamber increases (block 340) (e.g., as energy stored during the arc extinguishing cycle is released as current into the plasma chamber). The increase in voltage after the shunt switch has been opened at the end of the arc extinguishing cycle can be referred to as an increasing voltage condition. The shunt switch is pulsed to limit the increase in voltage of the increasing voltage condition (block 350). The voltage of the increasing voltage condition is limited to reduce the possibility of and/or prevent the development of an over-voltage condition.

If the arc is extinguished (block 360), the power supply unit resumes normal operation (block 380). In a normal operating mode, the shunt switch is turned-off (e.g., opened) until another arc is detected.

As shown in FIG. 3, if an arc is detected, the shunt switch is turned-on for a period of time or the shunt switch is pulsed one or more times (block 370). In some embodiments, an arc extinguishing cycle is initiated if an arc is detected. And in some implementations, the shunt switch is continuously pulsed until an over-voltage condition is no longer detected, but in other embodiments the shunt switch is pulsed whether an increasing voltage condition is detected or not in block 360. The duration(s) of the on-time and/or off-time of the pulse(s) of the shunt switch, in some embodiments, are defined based on the level of the voltage of the increasing condition.

Figure 4:
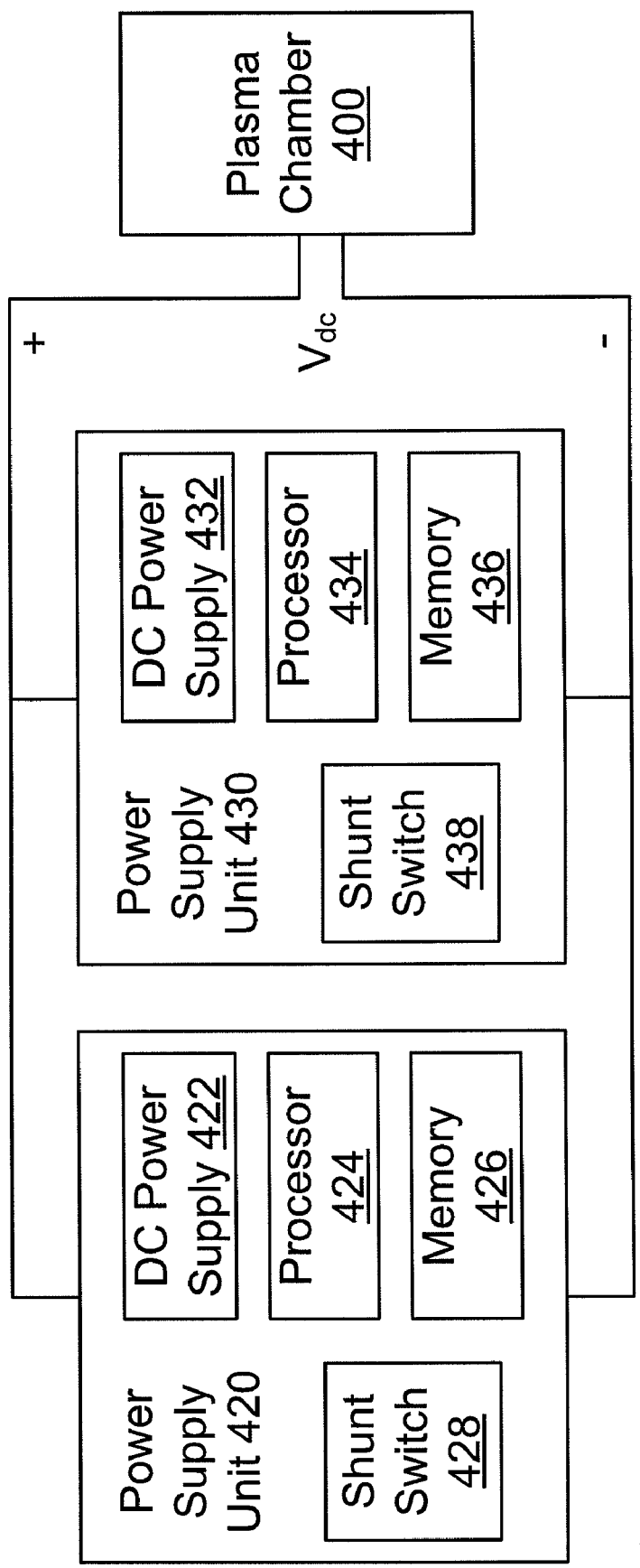
FIG. 4 is a schematic diagram that illustrates multiple power supply units configured to supply power to and extinguish an arc in a plasma chamber, according to an embodiment of the invention.

FIG. 4 is a schematic diagram that illustrates power supply units 420 and 430 configured to supply power to plasma chamber 400 and provide arc management, according to an embodiment of the invention. The power supply units 420 and 430 are connected in parallel to supply power to plasma chamber 400. Power supply unit 420 includes a DC power supply 422, a processor 424, a memory 426 and a shunt switch 428. Likewise, power supply unit 430 includes a DC power supply 432, a processor 434, a memory 436 and a shunt switch 438. In some embodiments, the power supply units 420 and 430 are different power supply units. For example, the power supply units 420 can be a 25 kilowatt power supply unit and power supply unit 430 can be a 50 kilowatt power supply unit.

Each of the power supply units 420 and 430 are configured to extinguish an arc when an arc is detected in the plasma chamber 400 using shunt switches 428 and 438, respectively, in arc extinguishing cycles. The power supply units 420 and 430 are also configured to limit an increasing voltage condition associated with the plasma chamber 400 by pulsing their respective shunt switches 428 and 438 after the arc is extinguished.

In some embodiments, the arc extinguishing cycles and/or pulse cycles associated with the power supply units 420 and 430 are coordinated. For example, the arc extinguishing cycles of each of the power supply units 420 and 430 can be implemented simultaneously or starting at different times. In some embodiments, power supply unit 420 is a master power supply unit that directly controls and/or triggers the arc extinguishing cycle and/or pulse cycles of power supply unit 430 as a slave power supply unit.

In some implementations, power supply unit 430 is a master power supply unit that is configured to detect plasma system parameter values such as the power output capabilities, arc extinguishing capabilities, and/or over-voltage prevention capabilities associated with power supply unit 420. Power supply unit 430 can use these plasma system parameter values to define, directly control and/or trigger the arc extinguishing cycle(s) and/or pulse cycle(s) (e.g., pulse parameter values) of power supply unit 420 and/or power supply unit 430.

The definition(s) (e.g., duration and/or timing) of one or more arc extinguishing cycles and/or one or more pulse cycles are calculated based on a set of rules and/or based on an algorithm associated with power supply unit 420 and/or power supply unit 430. For example, power supply unit 420, as a master power supply unit, can calculate the pulse parameter values (e.g., timing and duration) of a pulse implemented by power supply unit 430 based on plasma system parameter values associated with power supply unit 430 (e.g., power rating and/or components of power supply unit 430). Based on the definition of the pulse parameter values, the power supply unit 420 can trigger the shunt switch 438 of power supply unit 430 to pulse to reduce a voltage associated with an increasing voltage condition of plasma chamber 400.

In some embodiments, the definition(s) (e.g., duration and/or timing) of one or more arc extinguishing cycles and/or one or more pulse cycles associated with power supply unit 430 and/or power supply unit 420 are stored in and/or accessed from the memory 436 of the power supply unit 430. Power supply unit 430, in some variations, is configured to detect plasma system parameter values (e.g., power output capabilities, arc extinguishing capabilities, and/or over-voltage prevention capabilities) associated with a power supply unit added (not shown) in series or in parallel with power supply unit 430 and/or power supply unit 420.

Figure 5A:
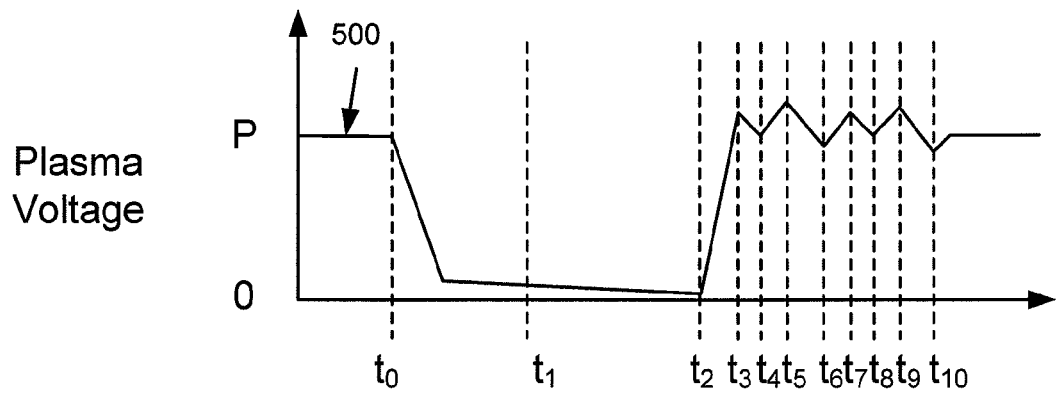
FIG. 5A is a schematic graph that illustrates a plasma voltage within a plasma chamber, according to an embodiment of the invention.
Figure 5B:
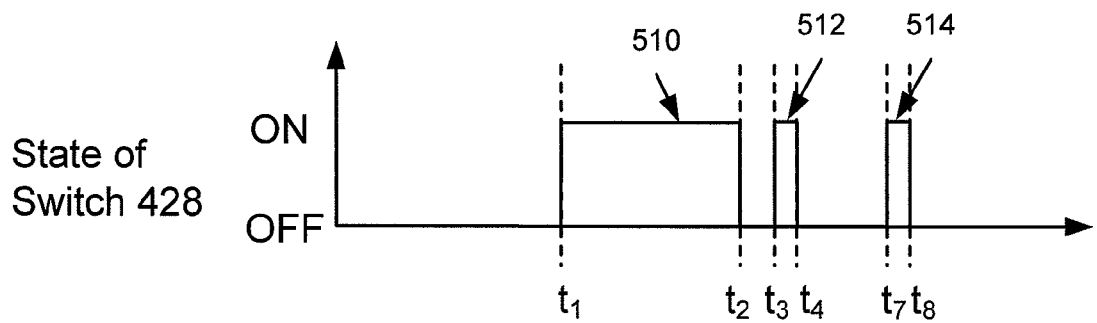
FIG. 5B is a schematic graph that illustrates a switch state of a shunt switch of a power supply unit, according to an embodiment of the invention.
Figure 5C:
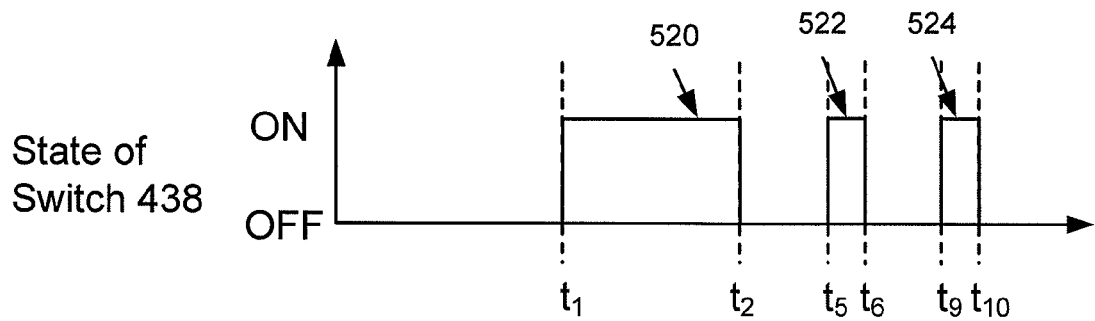
FIG. 5C is a schematic graph that illustrates a switch state of a shunt switch of a power supply unit, according to an embodiment of the invention.

FIGS. 5A through 5C are schematic graphs that illustrate extinguishing of an arc (e.g., micro arc) and prevention of an over-voltage condition using the power supply units 420 and 430 shown in FIG. 4, according to an embodiment of the invention. Specifically, FIG. 5A is a schematic graph that illustrates a plasma voltage 500 within plasma chamber 400, according to an embodiment of the invention. FIG. 5B is a schematic graph that illustrates a switch state of shunt switch 428 of power supply unit 420 and FIG. 5C is a schematic graph that illustrates a switch state of shunt switch 438 of power supply unit 430, according to an embodiment of the invention. Time increases to the right on the x-axis of each of the graphs.

FIG. 5A illustrates that, starting at time $t_0$, the plasma voltage drops from a voltage P to nearly zero in response to the formation of an arc within the plasma chamber where the voltage P is the output voltage set point of the power supply unit. At time $t_1$, the arc is detected, for example, by the power supply unit 420 based on a measurement value of the plasma current exceeding a threshold plasma current limit or based on a measurement value of the plasma voltage falling below a threshold plasma voltage limit.

As shown in FIGS. 5B and 5C, the arc extinguishing cycles 510 and 520 of power supply unit 420 and power supply unit 430, respectively, are started simultaneously at time $t_1$ when the arc is detected and are simultaneously ended at time $t_2$. In other embodiments, the arc extinguishing cycles 510 and 520 of the power supply units 420 and 430 start at different times, have different durations, and/or end at different times.

As shown in FIGS. 5B and 5C, the pulses 512 and 514 associated with power supply unit 420 and the pulses 522 and 524 associated with power supply unit 430 are staggered. For example, pulse 512 is started at time $t_3$ and pulse 522 is started at time $t_5$ after pulse 512 has ended at time $t_4$. Also, the pulses 512 and 514 have a different on-time than the pulses 522 and 524. The decreases in the plasma voltage 500 shown in FIG. 5A between times $t_2$ and $t_{10}$ correspond to the switch states (e.g., pulses) of each of the shunt switches 428 and 438 of the power supply units 420 and 430, respectively.

In some embodiments, one or more of the pulses associated with each of the power supply units 420 and 430 can be triggered at the same time and/or can have overlapping on-times. Also, in some implementations, the on-times and/or off-times of each of the pulse cycles, for example, for power supply unit 420 and/or power supply unit 430 are different.

Some embodiments of the invention relate to a computer storage product with a computer-readable medium having instructions or computer code thereon for performing various computer-implemented operations. The media and computer code may be those specially designed and constructed for the specific purpose or purposes. Examples of computer-readable media include, but are not limited to: magnetic storage media such as hard disks, floppy disks, and magnetic tape; optical storage media such as Compact Disc/Digital Video Discs ("CD/DVDs"), Compact Disc-Read Only Memories ("CD-ROMs"), and holographic devices; magneto-optical storage media such as floptical disks; carrier wave signals; and hardware devices that are specially configured to store and execute program code, such as Application-Specific Integrated Circuits ("ASICs"), Programmable Logic Devices ("PLDs"), Field Programmable Gate Arrays ("FPGAs"), and ROM and RAM devices.

Examples of computer code include, but are not limited to, micro-code or micro-instructions, machine instructions, such as produced by a compiler, and files containing higher-level instructions that are executed by a computer using an interpreter. For example, an embodiment of the invention may be implemented using Java, C++, or other object-oriented programming language and development tools. Additional examples of computer code include, but are not limited to, control signals, encrypted code, and compressed code.

In conclusion, the present invention provides, among other things, systems and methods for over-voltage protection of power supplies with a shunt switch across the output of the power supply supplying power to a plasma. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method for applying power to a plasma chamber, comprising:
   delivering power from a power supply unit to the plasma chamber to ignite and sustain a plasma;
   detecting an arc in the plasma;
   diverting a plasma current associated with the arc away from the plasma by closing at a first time for a first time period a shunt switch within the power supply unit so as to extinguish the arc, the shunt switch being opened at a second time at the end of the first time period when there is no arc in the plasma and a plasma voltage is at an extinguished level;
   increasing the plasma voltage to reignite the plasma when the shunt switch is open; and
   pulsing the shunt switch with a plurality of pulses as the plasma voltage increases after the shunt switch is opened at the second time, the shunt switch being closed during each pulse to limit increases in the plasma voltage so that the plasma voltage does not exceed a voltage limit, and the shunt switch being open during an off-time between pulses to increase the plasma voltage to a reignition level that ignites the plasma, the shunt switch remains open after the plasma is ignited until another arc is detected to sustain the plasma.

2. The method of claim 1 wherein the plurality of pulses are determined by pulse parameter values, each pulse parameter value includes at least one of a pulse width, a pulse period, a number of pulses, and the off-time between pulses.

3. The method of claim 2 further comprising:
   calculating the pulse parameter value based on a plasma system parameter value.

4. The method of claim 3, wherein the plasma system parameter value includes at least one of an output inductance of the power supply unit, an output capacitance of the power supply unit, an output current of the power supply unit, or an output voltage of the power supply unit.

5. The method of claim 1, wherein the power supply unit is a first power supply unit and a second power supply unit, the shunt switch is a first shunt switch associated with first power supply unit and a second shunt switch associated with the second power supply unit, the method further comprising:
   receiving a plasma system parameter value from the second power supply unit, the plasma system parameter value is used to calculate at least one of a pulse parameter value for pulsing the first shunt switch or a pulse parameter value for pulsing the second shunt switch.

6. The method of claim 1, wherein the shunt switch is a first shunt switch, wherein a second shunt switch is in parallel with the first shunt switch, and the pulsing further comprises:
pulsing the first shunt switch and the second shunt switch alternately out of phase with alternate pulses of the plurality of pulses.

7. An apparatus, comprising:
an output port that delivers power to a plasma chamber to ignite a plasma;
a shunt switch in parallel with the output port, the shunt switch is open while the output port delivers power to the plasma chamber;
a processor to control the shunt switch;
a non-transitory, tangible storage medium, encoded with instructions readable by the processor to extinguish an arc in the plasma and recover after the arc is extinguished, the instructions including instructions to:
detect an arc in the plasma;
divert a plasma current associated with the arc away from the plasma by closing at a first time for a first time period a shunt switch within the power supply unit to extinguish the arc, the shunt switch being opened at a second time at the end of the first time period when there is no arc in the plasma and a plasma voltage is at an extinguished level;
increase the plasma voltage to reignite the plasma when the shunt switch is open; and
pulse the shunt switch with a plurality of pulses as the plasma voltage increases after the shunt switch is opened at the second time, the shunt switch being closed during each pulse to limit increases in the plasma voltage so that the plasma voltage does not exceed a voltage limit, and the shunt switch being open during an off-time between pulses to increase the plasma voltage to a reignition level that ignites the plasma, the shunt switch remains open after the plasma is ignited until another arc is detected to sustain the plasma.

8. The apparatus of claim 7, wherein the pulse cycles are based on a pulse parameter value, the pulse parameter value includes at least one of a pulse width, a pulse cycle period, a number of pulses, and an off-time.

9. The apparatus of claim 7, wherein the pulse cycles are based on a pulse parameter value, the processor is configured to calculate the pulse parameter value based on a plasma system parameter value, the plasma system parameter value includes at least one of an output inductance of a power supply unit, an output capacitance of the power supply unit, an output current of the power supply unit, and an output voltage of the power supply unit.

10. The apparatus of claim 7, further comprising a memory configured to store a pulse parameter value associated with the pulse cycles.

11. The apparatus of claim 7, wherein the output port, shunt switch and processor are included in a power supply unit.

* * * * *